(12) United States Patent
Kostka

(10) Patent No.: US 8,247,820 B2
(45) Date of Patent: Aug. 21, 2012

(54) UTILIZING GRADIENT REFRACTIVE INDEX FILMS FOR LIGHT EXTRACTION AND DISTRIBUTION CONTROL IN OLED

(75) Inventor: James Michael Kostka, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 392 days.

(21) Appl. No.: 12/643,512

(22) Filed: Dec. 21, 2009

(65) Prior Publication Data

US 2011/0147773 A1    Jun. 23, 2011

(51) Int. Cl.
*H01L 33/00* (2010.01)
*H01L 51/00* (2006.01)
(52) U.S. Cl. .......................................... 257/79; 313/506
(58) Field of Classification Search .................... 257/79, 257/88, 98–100, E51.019; 313/503–511
See application file for complete search history.

(56) References Cited

U.S. PATENT DOCUMENTS

| | | | |
|---|---|---|---|
| 7,554,263 B2 * | 6/2009 | Takahashi | 313/506 |
| 2002/0094422 A1 | 7/2002 | Tsai | |
| 2003/0184219 A1 | 10/2003 | Duggal | |
| 2004/0160171 A1 | 8/2004 | Takahashi | |
| 2008/0049442 A1 | 2/2008 | Choo | |
| 2009/0051278 A1 * | 2/2009 | Saneto et al. | 313/504 |

OTHER PUBLICATIONS

WO Search Report issued in connection with corresponding WO Patent Application No. US10/055073 filed on Nov. 2, 2010.

* cited by examiner

*Primary Examiner* — Calvin Lee
(74) *Attorney, Agent, or Firm* — Fay Sharpe LLP

(57) ABSTRACT

The present invention relates to an electro-optical device, wherein the device is a light source, for example an OLED. The OLED includes at least a substrate, a cathode, an anode, one or more organic light-emissive materials disposed between the cathode and anode, and a gradient refractive index film disposed on an external, light emitting surface of the device, for example on the substrate layer. Alternatively, the device may be constructed with the gradient refractive index film as the substrate, and/or the gradient refractive index film may be applied to more than one light-emitting surface of a device.

16 Claims, 1 Drawing Sheet

UTILIZING GRADIENT REFRACTIVE INDEX FILMS FOR LIGHT EXTRACTION AND DISTRIBUTION CONTROL IN OLED

BACKGROUND OF THE DISCLOSURE

The present invention relates to the use of gradient refractive index films in electro-optical devices to enhance light or energy propagation. More particularly, the invention relates to the use of gradient refractive index films on light sources, for example OLED light sources, to enhance light extraction and distribution control. It is to be understood, however, that the invention disclosed herein has utility and application in related areas and with other electro-optical devices, including other types of light sources and displays.

Electro-optical devices involve components and systems which operate by modification of the optical properties of a material by an electric field, i.e., by modification of the interaction between the electromagnetic (optical) and the electrical (electronic) states of materials. Such devices include but are not limited to solid state light sources, such as OLEDs and LEDs. Because the devices operate on the principle of generation of energy and the transmittance of that energy through one or more different mediums before the energy is extracted from the device to perform its intended function, for example as a lighting device, there is the potential for energy loss due to a mismatch in the refractive indexes of the various mediums present through which the energy must travel.

Organic light emitting diodes (OLEDs) are known. As is generally understood, an OLED device typically includes one or more organic light emitting layers disposed between electrodes, e.g., a cathode and a light-transmissive anode, formed on a substrate, which may also be light-transmissive. Upon application of an electric current, electrons may be injected into the organic layer from the cathode, and holes may be injected into the organic layer from the anode. The electrons and the holes generally travel through the organic layer until they recombine at a luminescent center, typically an organic molecule or polymer, this recombination process resulting in the emission of a light photon, usually in the visible region of the spectrum. Therefore, as used herein, the term "organic light emitting diode" generally refers to a device including at least electrodes and one or more active layer(s), including an organic material (molecule or polymer), the device exhibiting the characteristic of electroluminescence. Depending on the exact composition of the luminescent center(s) within the light emitting layer, light in one or more color bands may be emitted.

Typically, the layers of an OLED are arranged, as stated above, so that the organic layers are disposed between the cathode and anode layers. As photons of light are generated and emitted, the photons move through the organic layer. Those that move toward the cathode, which generally comprises a non-light transmissive material, for example a metal, may be reflected back into the organic layer. Those photons that move through the organic layer to the light-transmissive anode, and finally to the substrate or other outer surface layer, however, may be emitted from the OLED in the form of light energy. Even though the substrate may be light-transmissive, due to the difference in refractive index of the substrate material with that of the external medium (typically air), some portion of the photons are trapped within the device due to total internal reflection. As the refractive index mismatch becomes larger between two mediums or layers of the device, or between the outermost layer of the device and the external environment, the total internal reflection of the light also increases. Therefore, the trapped photons are not able to escape the device, and thus the OLED operates at less than 100% efficiency with respect to light generated within the device, and subsequently light emitted.

As can be seen from the foregoing, by reducing the refractive index mismatch of the materials through which light energy passes before it is emitted, including the external medium, which is most likely air, light output may be optimized. It would be desirable, therefore, to provide a means for reducing the refractive index mismatch of a light source in order to maximize light output. In addition, it would be desirable to reduce the refractive index mismatch of a light source in order to better optimize light distribution.

SUMMARY OF THE DISCLOSURE

In one embodiment, an electro-optical device is provided, wherein the device is a light source, and the light source is an OLED. The OLED includes at least a substrate, a cathode, an anode, one or more organic light-emissive materials disposed between the cathode and anode, and a gradient refractive index film disposed on an external, light emitting surface of the device, for example on the substrate layer. Further optional layers that may or may not be included in the light source structure include, but are not limited to, electron injection layers, hole injection layers, electron transport layers, hole transport layers, electron blocking layers, hole blocking layers, and exciton blocking layers.

In another embodiment, an electro-optical device is provided, wherein the device is a light source, and the light source is an OLED including at least a gradient refractive index film layer having disposed thereon at least an anode, a cathode, and one or more organic light-emissive materials disposed between the anode and cathode. Further optional layers that may or may not be included in the light source structure include, but are not limited to, electron injection layers, hole injection layers, electron transport layers, hole transport layers, electron blocking layers, hole blocking layers, and exciton blocking layers.

In another embodiment, an electro-optical device is provided, wherein the device is a light source, and the light source includes at least an anode, a cathode, one or more organic light-emissive materials disposed between the anode and cathode, and one or more gradient refractive index films disposed on one or more light-emitting surfaces of the device. In this embodiment, the cathode is constructed from a light-transmissive material, and the device emits light energy in a multi-directional manner. Therefore, gradient refractive index films may be disposed on any one or more light-emitting surfaces of the device in order to improve the percentage of light that escapes. Further optional layers that may or may not be included in the light source structure include, but are not limited to, electron injection layers, hole injection layers, electron transport layers, hole transport layers, electron blocking layers, hole blocking layers, and exciton blocking layers.

DETAILED DESCRIPTION OF THE PREFERRED EMBODIMENTS

Figure 1:
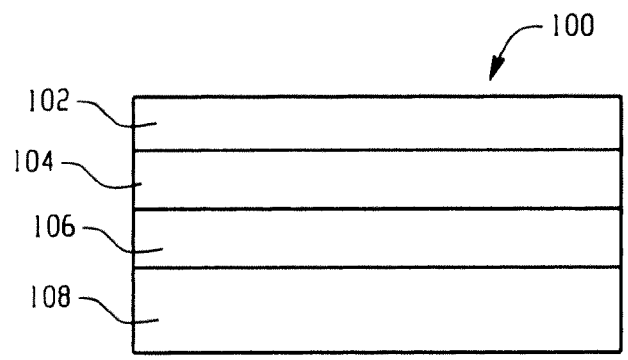
FIG. 1 is a diagram of an OLED structure known in the art.

Throughout the specification, certain terms and phrases may be used that have the definitions provided herein. Those terms or phrases not defined will be attributed with the broadest meaning thereof as known to those of skill in the field of art to which the invention pertains. Approximating language may be applied to modify any quantitative representation that may vary without resulting in a change in the basic function to which it is related. Accordingly, a value modified by a or terms, such as "about" and "substantially," may not be limited to the precise value specified, in some cases. The modifier "about" used in connection with a quantity is inclusive of the stated value and has the meaning dictated by the context, for example includes a degree of error associated with the measurement of a particular quantity. In addition, "optional" or "optionally" means that the described material, event or circumstance may or may not be present or occur, and that the description includes instances where the event or material occurs/is present and also instances where the event or material does not occur/is not present. Singular forms such as "a", "an", and "the" include plural referents unless the context clearly dictates otherwise. All ranges disclosed herein are inclusive of the recited endpoints and are independently combinable. Finally, as used herein, the phrases "adapted to," "configured to," and the like refer to elements that are sized, arranged, or manufactured to form a specified structure or to achieve a specified result.

Now therefore, with reference to the various embodiments presented herein, light energy emitted by an electro-optical device, and particularly by a light source, can be optimized by controlling and minimizing the refractive index mismatch of the outermost surface of the device with that of the external medium. As used herein, the teen "electro-optical device" may be use to mean any device that emits energy, including but not limited to light sources such as OLEDs, LEDs, other light sources, and the like. For purposes of this disclosure, the invention will be described with specific reference to an OLED device. However, the principles of operation and application thereof to other electro-optical devices will be readily discerned by those skilled in the relevant field of technology.

One characteristic present in most if not all light-transmissive materials is a refractive index. Therefore, those materials present in the device which are transparent and/or light-transmissive exhibit and may be characterized by a refractive index value particular to that material. "Refractive index" as used herein refers to a measure of the reduction in the velocity of light as it is transmitted through a medium. The refractive index of a transparent optical medium is the factor by which the velocity of light traveling through the medium, v, is decreased relative to the velocity of light traveling through a vacuum:

$$n = \frac{c}{v}$$

wherein n is the index of refraction of the material, c is the velocity of light in a vacuum, and v is the velocity of light in the material. Assuming that light waves transmit linearly through a medium, the refractive index can be calculated from the relative permittivity $\epsilon$ and the relative permeability $\mu$ of a material: $n^2 = \epsilon\mu$ Typically, refractive index values for glasses and polymers that transmit light in the visible spectrum range from 1.2-3.0. Further, the refractive index value for a material typically increases as the wavelength of transmitted light shortens, though this change is minimal. For purposes of this disclosure, refractive index values are therefore approximate values.

As discussed previously herein, in the case of OLED structures, light energy, in the form of photons or rays of light, is generated in the organic layers and then transmitted through the organic layers and either reflected back into the device by the non-transmissive cathode layer or emitted from the device subsequent to transmission through the anode and any substrate or other intervening layers that may be present, assuming the same to be constructed from light-transmissive material. It is noted, however, that some cathode materials may be light-transmissive, and in some embodiments light may be emitted from the cathode layer, and from the device, in a multi-directional manner. Regardless of how many light transmissive surfaces a device may have, the light energy is almost always refracted before being emitted from the device. The term "refraction" is used herein to refer to a change in direction of a light wave that occurs as the wave encounters a new or different medium. This change in direction results from a change in the speed of the wave. The change in direction is directly related to the difference in the refractive indexes of the two or more different materials, or the refractive index mismatch, that the light wave encounters.

As used herein, the term "light-transmissive" refers to materials or devices that allow a substantial portion of the light energy generated by the material or device to pass through that material or device and be emitted in the form of light, though some portion of the energy generated may be scattered, absorbed, or reflected back into the material or device. Light-transmissive materials/devices include those that are considered to be translucent, transparent, opaque, or any other state, so long as some light energy passes through and is emitted.

As a light wave or ray is generated within a layered device of the type described herein, it meets a given layer or medium within the device at an angle referred to as the incident angle. Assuming that the layers, or mediums, are arranged within the device such that the refractive index of each successive layer the light wave encounters is less than that from which the light wave has been emitted, the light bends away from the normal, generally at an angle similar to but larger than the incident angle of the light wave, and the angle of incidence increases or gets larger. The increase in the incident angle is due to a difference in the refractive index of the two mediums, or a mismatch, causing the refracted light wave to exhibit a larger angle than the angle of incidence. That instance where the emitted light ray is refracted or bent to 90° from the normal is known as the critical angle as this is the largest possible incident angle that can result in a light wave or ray escaping the medium, or being emitted. Beyond this point, the light behaves differently. When this occurs, and the critical angle for the two mediums is exceeded, a phenomenon known as "total internal reflection", or TIR, occurs. This means that light rays are no longer exiting the higher index medium and being refracted by the lower index medium, but instead are being reflected inside the device, internally. A light ray that experiences TIR, once reflected, is again affected by the normal laws of reflection, refraction, and absorption. It is noted that TIR only occurs when a ray is being transmitted from a material of higher index of refraction to a material of lower index of refraction.

The critical angle of a boundary between two mediums with varying refractive indexes can be determined using Snell's Law:

$$\frac{\sin\alpha_1}{\sin\alpha_2} = \frac{n_2}{n_1}$$

wherein 1 and 2 correspond to the first and second media, respectively, and therefore where $\alpha_1$ corresponds to the angle of incidence and $\alpha_2$ corresponds to the angle of refraction and n is the index of refraction of the material. The largest possible angle of incidence that results in a refracted ray, as opposed to total internal reflection, is referred to as the critical angle. The critical angle is measured with respect to the normal to the surface, and any incident light ray that is above the critical angle is subjected to total internal reflection. In the case of the critical angle, the angle of refraction, $\alpha_2$, is 90°, and therefore sin $\alpha_2$ is equal to 1. The angle of incidence is the critical angle, therefore $$\theta_c = \arcsin\left(\frac{n_2}{n_1}\right)$$

where $\theta_c$ is the critical angle, $n_2$ is the refractive index of the material with the lower refractive index value, and $n_1$ is the refractive index of the material with the higher refractive index value. Therefore, if the refractive indexes of the two mediums are known, $\theta_c$ is easily calculated.

To illustrate the foregoing, assume for example that a light ray is being transmitted from a medium having a higher refractive index, n=1.5, to a medium with a lower refractive index, n=1.0. Assume further that the incident angle in the higher refractive index medium is 30° ($\alpha_1$). Using these values, Snell's Law can now be used to determine the angle at which the light ray will be refracted as it enters the medium with the lower refractive index:

1.5 sin 30°=1.0 sin $\alpha_2$ such that $\alpha_2$=49°. Therefore, as stated above, the angle of incidence is increased as the ray is transmitted into the medium of lower refractive index. Using Snell's Law yet again, the increased angle of incidence can be calculated for that scenario where the refractive indexes of the mediums remain the same, 1.5 and 1.0, but the angle of incidence in the first medium, having the higher refractive index, is now 35°. The increased angle of incidence in the lower refractive index medium is calculated to be:

1.5 sin 35°=1.0 sin $\alpha_2$ such that $\alpha_2$=59°.

If it is assumed that the mediums again remain the same, but the angle of incidence through the first medium is 41.8°, the angle of refraction in the lower refractive index material is calculated to be 90°, therefore 41.8° represents the critical angle. Therefore, any ray of light having an angle of incidence greater than 41.8°, and traveling through mediums having the stated refractive index mismatch, i.e., 1.5 and 1.0, will be subject to total internal reflection. For that scenario where the refractive index mismatch is smaller, for example 1.5 and 1.4, the critical angle is calculated to be 69°. Therefore, most incident rays that fall between 0° and 69° will be refracted and transmitted, while incident rays having a higher angle of incidence will experience TIR.

Again, with reference to the various embodiments presented herein, energy emitted by an electro-optical device, and particularly light energy emitted by a light source, can be optimized by controlling and minimizing the refractive index mismatch between the outer most surface of the device and that of the external medium. In light of the foregoing discussion regarding TIR, it is seen that by minimizing the difference in the refractive indexes of the layers through which light energy must pass before being emitted, the TIR is reduced and the device operates much more efficiently, i.e., less light energy is reflected back into the device and more light energy is emitted. In one embodiment, this is accomplished by positioning a gradient refractive index film, or a GRIN film, on the outermost light-emitting surface of the device.

As noted above, electro-optical devices that may be adapted for use of a gradient refractive index film include light sources such as OLEDs, LEDs, and other light sources. In one embodiment, an electro-optical device is provided wherein the device is a light source, and the light source is an OLED. The OLED includes at least a substrate, a cathode, an anode, one or more organic light-emissive materials disposed between the cathode and anode, and a gradient refractive index film disposed on an external, light emitting surface of the device, for example on the substrate layer. Further optional layers that may or may not be included in the light source structure include, but are not limited to, electron injection layers, hole injection layers, electron transport layers, hole transport layers, electron blocking layers, hole blocking layers, and exciton blocking layers.

In another embodiment, an electro-optical device is provided, wherein the device is a light source, and the light source is an OLED including at least a gradient refractive index film layer having disposed thereon at least an anode, a cathode, and one or more organic light-emissive materials disposed between the anode and cathode. Further optional layers that may or may not be included in the light source structure include, but are not limited to, electron injection layers, hole injection layers, electron transport layers, hole transport layers, electron blocking layers, hole blocking layers, and exciton blocking layers.

In still another embodiment, an electro-optical device is provided, wherein the device is a light source, and the light source includes at least an anode, a cathode, one or more organic light-emissive materials disposed between the anode and cathode, and one or more gradient refractive index films disposed on one or more light-emitting surfaces of the device. In this embodiment, the cathode is constructed from a light-transmissive material, and the device emits light energy in a multi-directional manner. Therefore, gradient refractive index films may be disposed on any one or more light-emitting surfaces of the device in order to improve the percentage of light that escapes. Further optional layers that may or may not be included in the light source structure include, but are not limited to, electron injection layers, hole injection layers, electron transport layers, hole transport layers, electron blocking layers, hole blocking layers, and exciton blocking layers.

The cathode layer in an OLED light source in accord with some embodiments may comprise any material known for use in light source structures and is not necessarily a limiting aspect of the claimed invention. For example, cathodes generally comprise a material having a low work function such that a relatively small voltage causes the emission of electrons. Commonly used materials include metals, such as gold, gallium, indium, manganese, calcium, potassium, sodium lanthanum, cerium, tin, lead, aluminum, silver, magnesium, lithium, strontium, barium, zinc, zirconium, samarium, europium, and mixtures or alloys of any two or more thereof. These materials are generally non-light-transmissive and therefore the refractive index is not an important design consideration for light extraction from the device. Preferred cathode layer materials include alloys such as Al—Mg, Al—Li, In—Mg, and Al—Ca, and single metals, such as Al. Layered structures may also be used, such as a thin layer of a metal such as Ca, with a thickness of about 1 to about 10 nm, or a non-metal such as LiF, covered by a thicker layer of another metal such as Al or Ag. Typically the thickness of the cathode layer is from about 75 nm to about 150 nm.

In some embodiments, the device is a transparent OLED (TOLED) that utilizes a semi-transparent cathode. This type of device allows light to escape from more than one surface of the device, or to emit light in a multi-directional manner. Such devices can be made with cathodes of, for example, a very thin layer of silver or another material that at small thicknesses is conductive and semi-transparent. Typically the thickness of the cathode layer in a TOLED is from about 10 nm to about 100 nm.

Generally, for most OLED configurations, including TOLED configurations, the cathode deposition is the last step in device fabrication, followed by the addition of a protective cover that encapsulates the device. Therefore, these devices generally include at least one intermediate layer (the encapsulation layer) between the outermost surface of the cathode and the external environment, and will benefit from the presence of a means to reduce any refractive index mismatch of these layers with one another and/or with the external environment.

The anode layer in an OLED light source according to some embodiments is generally comprised of a material having a high work function value, as compared to that of the cathode. Materials known for use in the anode layer of light source devices are generally light-transmissive. Suitable materials include, but are not limited to: transparent conductive oxides, such as tin oxide, indium oxide, zinc oxide, cadmium tin oxide, indium tin oxide (ITO), aluminum doped zinc oxide (AZO), fluorine doped tin oxide (FTO), indium doped zinc oxide, magnesium indium oxide, and nickel tungsten oxide; metals, such as gold, aluminum, and nickel; conductive polymers such as poly(3,4-ethylenedioxythiophene) poly(styrenesulfonate) (PEDOT:PSS); and mixtures and combinations or alloys of any two or more thereof. In some embodiments, the anode is light-transmissive, and thus the material used to construct this layer of the OLED device has a characteristic refractive index.

The OLED device further comprises an organic layer disposed between the cathode and anode layers. The organic layer comprises one or more layers or materials, one of which has the ability to transport holes and another of which has the ability to transport electrons. In addition, the organic layer(s) function as the electroluminescent center. When a voltage is applied, a current of electrons flows through the device from the cathode to the anode. The anode, in response to the current, injects positive charges, or holes, into the hole transport layer, while the cathode injects negative charges, or electrons, into the electron transport layer. Electrostatic forces bring the electrons and holes together and they combine near the luminescent center, causing a drop in the energy level and an emission of radiation in the infrared, ultraviolet, or visible light wavelengths of the spectrum. The organic layer(s) is therefore chosen to electroluminesce in the desired wavelength range. The organic layer material may be a polymer, a copolymer, a mixture of polymers, or lower molecular weight organic molecules having unsaturated bonds. Such materials possess a delocalized π-electron system, which gives the polymer chains or organic molecules the ability to support positive and negative charge carriers with high mobility. Suitable polymers include: poly(n-vinylcarbazole); poly(alkylfluorene) such as poly(9,9-dihexylfluorene), poly(dioctylfluorene), or poly(9,9-bis(3,6-dioxaheptyl)-fluorene-2,7-diyl); poly(praraphenylene) and its derivatives; and mixtures of these polymers or copolymers based on these polymers. Other suitable polymers include those in the class of polysilanes, such as poly(di-n-butylsilane), poly(methylphenylsilane), poly(di-n-pentylsilane), poly(di-n-hexylsilane), and poly(bis(p-butylphenyl)silane). Suitable organic materials having molecular weights less than about 5000 and having a large number of aromatic units include 1,3,5-tris(n-(4-diphenylaminophenyl) phenylamino)benzene, and other such polymers. Suitable lower molecular weight organic molecules include phenylanthracene, tetraarylethene, coumarin, rubrene, tetraphenylbutadiene, anthracene, perylene, coronene, and their derivatives. Suitable low molecular weight metal organic complexes include aluminum-, gallium-, and indium-acetylacetonate, aluminum-(picolymethylketone)-bis(2,6-di(t-butyl)phenoxide) or scandium-(4-methoxypicolylmethylketone)-bis(acetylacetonate). The foregoing materials are known to emit light at a characteristic wavelength for that specific material. Therefore, use of these and other polymers will be based on the desired wavelength range to be emitted, which determines the color of the emitted light. These and additional organic layers that may be used to aid in the injection and transport of electrons are set forth in U.S. Pat. No. 6,891,330, to our common assignee, the entire disclosure of which is incorporated herein by reference.

FIG. 1 is a diagram of the basic structure of an OLED 100 as known in the art. The OLED 100 includes a cathode layer 102, at least one organic layer 104, an anode layer 106, and a substrate layer 108. While this FIG. 1 depicts each component as a layer, this is only for representative purposes, and each component may be otherwise configured as known in the art without detracting from the overall intention and purpose of the invention. In addition, other layers may be present as discussed herein, for example, organic layer 104 may comprise additional layers, for example layers to aid in transporting and injecting electrons into the luminescent center, among others.

Based on the discussion above with respect to refractive index, and with reference to FIG. 1, it can be seen that as light energy is emitted from the organic layer(s) 104, also known as the luminescent center, it must first transmit through the anode layer 106 and substrate 108 before it is output from the OLED as light, which may be in any portion of the visible, IR or ultraviolet spectrum depending on the luminescent center and the band gap thereof.

Materials commonly used in the cathode layer are non-light-transmissive materials. For example, the metals commonly used in the cathode layer either absorb and/or reflect light energy emitted by the organic layer, but do not generally transmit light efficiently. In the standard OLED configuration in which light is emitted from one plane of the device, it is desirable to have a highly reflective cathode such that the majority of the light is emitted from the anode-bearing portion or side of the device. The anode layer, including any optional layers that may be disposed thereon, unlike the cathode layer, is generally constructed from a light-transmissive material with a refractive index on the order of less than about 2.5, though other materials may be used. The anode material must also efficiently transfer electrons or current. Most known anode layer materials exhibit a refractive index value of at least about 1.5.

Figure 2:
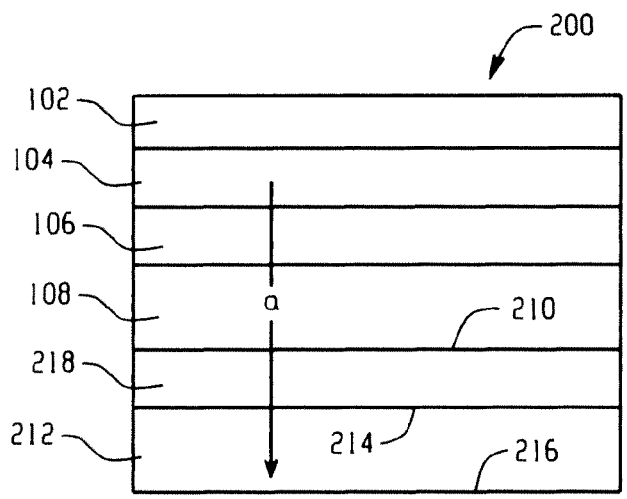
FIG. 2 is a diagram of an OLED structure according to an embodiment of the invention.
Figure 3:
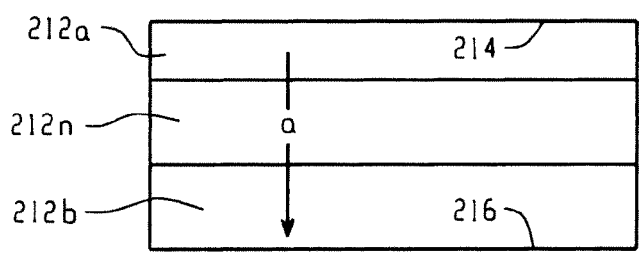
FIG. 3 is a diagram of the multi-layer GRIN film according to an embodiment of the invention.

In one embodiment of the invention, as set forth in FIG. 2, in which like numbers designate layers or portions in keeping with FIG. 1, the refractive index value of the layer adjacent to the external environment is reduced, and light output therefore increased, by providing an additional layer or film on the outer surface 210 of layer 108 of OLED 200. The "outer surface" is defined as that surface in contact with the environment, such as air (RI=1.0), surrounding the OLED. The additional layer or film is the gradient refractive index film, or GRIN film 212, referred to above. As has been stated, the refractive index of the film becomes less progressing through the film from the first surface thereof, surface 214 (shown in FIG. 3) which is in contact with outer surface 210 of layer 108, to a second surface 216 (also shown in FIG. 3) of the GRIN film which is in contact with the environment surrounding the OLED. Additionally, the first surface of the GRIN layer exhibits a refractive index less than or at most equal to that of the outer surface 210 of layer 108.

FIG. 2, therefore, provides a diagram of an OLED according to an embodiment of the disclosure wherein OLED 200 has deposited on the outer surface 210 of OLED 200 a GRIN film 212. Of course, should other layers be deposited on surface 210, the GRIN film 212 would then be deposited on the outer-most surface 210 of the device 200. For example, a layer of index matching adhesive 218 may be disposed adjacent surface 210.

For example, GRIN film 212 is a composite or multi-layer structure having at least two layers of material with different refractive indexes, thereby providing the gradient refractive index for the film as a whole. This is better seen with reference to FIG. 3 which is a diagram of just GRIN film layer 212, showing the same to be a multi-layer film, or a composite film. Now then, GRIN film 212 is constructed such that each successive layer, from first surface 214 of the GRIN film through second surface 216, has a refractive index lower than the preceding material or layer, in the direction of arrow a. First surface 214 is that surface which is positioned immediately adjacent the outer surface 210 of layer 108 of OLED 200, which may be anode layer 106 or substrate layer 108, or any additional layer deposited thereon, and second surface 216, is that surface of the GRIN layer which is in contact with or exposed to the surrounding environment. In keeping with the description above, the first layer in the multi-layer GRIN film, which is placed adjacent the anode or substrate, or any additional layer deposited thereon, will have a given refractive index value that is no greater than the refractive index of the anode, substrate, or other possible intervening layer. Each successive layer of the multi-layer GRIN film, progressing outward from the first GRIN film layer 212a, and designated η in FIG. 3, and wherein η may be one or more layers, will exhibit a refractive index of less than or equal to, but not greater than, the film layer immediately preceding it. In this manner, the GRIN film provides a gradient refractive index, thus minimizing the difference in refractive index between the outer most surface of the OLED and the external environment. As the mismatch between refractive indexes is reduced, light emitted from the device increases. With respect to FIG. 2, it is seen that light emitted from the organic material layer 104 of the OLED 200 is transmitted through the GRIN film 212 in the direction of arrow a. As the refractive index is reduced, less light is reflected back into the device and, therefore, a greater percentage of the generated light is emitted, i.e., light output is increased.

Figure 4:
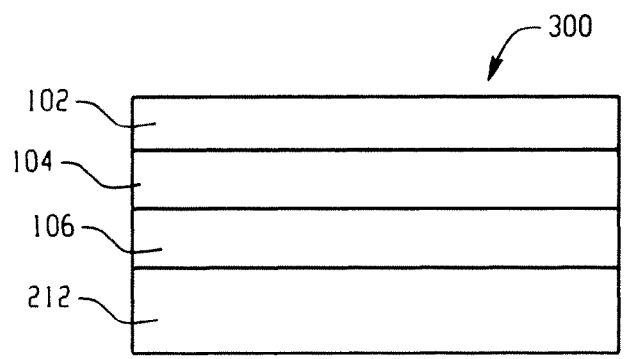
FIG. 4 is a diagram of an OLED structure according to an embodiment of the invention.

FIG. 4 sets forth that embodiment wherein the OLED 300 is constructed directly on the GRIN film layer 212 without using a substrate layer. Therefore, this device includes a GRIN film layer 212 having disposed thereon a transparent anode layer 106, followed by organic layer(s) 104 and a cathode layer 102.

Therefore, in one embodiment, an OLED device is provided wherein the device includes a GRIN film layer disposed on the light emitting surface of the device such that as light is emitted from the OLED it encounters and is transmitted through the GRIN film, having two or more layers exhibiting reducing refractive index values such that an overall reducing gradient refractive index of the device is provided, thereby allowing a greater percentage of generated light to be emitted, and thus enhancing the efficiency of the light source output. Such a GRIN film may also be referred to as an "out coupling film", meaning the film aids in extracting the photons of light that are trapped in the waveguided mode within the device, hence increasing the overall light output of the device.

In another embodiment, an OLED device is provided wherein the device has more than one light emitting surface, and a GRIN film layer is disposed on each light emitting surface or more than one light emitting surface of the device such that as light is emitted from the OLED it encounters and is transmitted through the GRIN film, having two or more layers exhibiting reducing refractive index values such that an overall reducing gradient refractive index of the device is provided, thereby allowing a greater percentage of generated light to be emitted, and enhancing the efficiency of the light source output.

In any of the foregoing embodiments, the light source including the OLED and the gradient refractive index film may be constructed such that the layers of the OLED are disposed on a glass or polymer substrate, with a separate GRIN film applied to the outer surface of the substrate with an index-matching adhesive.

In another embodiment, the GRIN film described above may be used to enhance the distribution of the light output of a light source. In this regard, the light source, for example an OLED constructed in accord with the foregoing disclosure, may include a GRIN film, also as disclosed herein. In order to better focus the light energy emitted from the device, the GRIN film, which functions to optimize performance by minimizing the refractive index mismatch of the various layers of the device with one another, and of the device with the surrounding environment, such as air, is used to further enhance the device performance by optimizing the focus of the emitted light. This may be accomplished by bending the GRIN film, and using the convex nature of the bend to cause light rays to be emitted in a more directed manner, or with a more focused beam.

The invention will now be described with respect to the following Examples, which are provided merely to aid the reader in understanding various parameters and features of the claimed invention. The Examples are not intended to in any way limit the scope of this disclosure, which is to be accorded the full breadth of the appended claims and all permutations and variations thereof. Deposition techniques are known to those skilled in the art, and are known to vary depending on the exact materials being used, as well as on the purpose for which the device is to be employed. Therefore, while specific deposition detail has not been provided herein, it is to be understood that standard deposition practices and techniques apply.

EXAMPLE 1

In this Example 1, there is provided a gradient refractive index film design which may be applied to a light source. The gradient refractive index film was created by laminating two plastic films together with a pressure sensitive adhesive. One layer of the GRIN film comprised a Zeonor cyclo olefin plastic, which had a RI of about 1.53 and a thickness of 0.0015 inches. Next, a 0.001 inch thick layer of acrylic optical adhesive was laminated to the cyclo olefin layer. This acrylic material exhibited a RI of about 1.47, which is less than the preceeding layer. Finally, a 0.001 inch thick layer of fluorinated ethylene propylene (FEP) was laminated to the other side of the acrylic adhesive. The FEP layer exhibited a RI of about 1.34. The total resulting structure was: FEP(RI=1.34)/Acrylic adhesive (RI=1.47)/Zeonor cyclo olefin (RI=1.53). As can be seen, the refractive index of the various layers of the GRIN film transition from 1.34 to 1.53 providing a RI gradient.

EXAMPLE 2

For testing purposes, the film of Example 1 was applied to a hermetically packaged OLED. The Zeonor cyclo olefin side of the GRIN film was optically coupled to the outer most surface of the OLED package (PET, RI~1.58) with an index matching oil. Prior to application of the GRIN film, the on-axis luminance of the OLED was measured using a Radiant Imaging Camera. Software was used to analyze the data from the image produced by the camera. The on-axis luminance of the OLED was determined to be 649 cd/m². The GRIN film, constituted as identified above, was then applied to the same OLED and the device was operated at the identical drive current as the OLED without the GRIN film. With the device operated at this same drive current, the on-axis luminance was determined in accord with the procedure used to measure the on-axis luminance of the device without the GRIN film and was found to exhibit an increase of about 4%, to 673 cd/m². On-axis luminance is generally a measure of the brightness of an object viewed straight on, as opposed to from an angle. Additionally, there was only a modest shift in color upon application of the film ($\Delta CCx=0.0009$, $\Delta CCy=0.0010$). Many films known in the art tend to cause a noticeable shift in the color of the light source. Unexpectedly, when comparing the device constructed for this Example 2, with and without the GRIN film applied, it was found that the GRIN film did not cause any significant color shift. In general, the GRIN film causes a color shift of less than 10%, and preferably substantially less than 10%. Therefore, the GRIN film provides a desirable advantage in many applications over other known out coupling films for light sources or displays. The enhancement with regard to on-axis luminance exhibited by the OLED having a GRIN film applied on the light emitting surface thereof showed an unexpected gain in overall device light emission.

Without wishing to be bound by any specific theory, the following has been shown. It was expected that as light was propagated through the GRIN film it would be refracted to higher angles according to Snell's Law, thereby potentially maintaining the trapped state of the light. However, the gradient refractive index film helped minimize the critical angle between any two adjacent layers. Based on this finding, it is theorized that if scattering or multiple reflections of the light occurs, there is actually an increased probability that the scattered or reflected light will enter the next closest medium, as opposed to remaining trapped within a layer. As this occurs over the entire film, the film is shown to make the device more efficient at allowing light to escape, or extracting light. This differs from the effect of using a single layer of material, which would provide only one change in refractive index. Rather, with the GRIN film, which is a composite or multi-layer film, wherein each successive layer of material the light encounters has a lower refractive index, the light is more gradually refracted, until it is finally emitted from the device. In this manner, the ultimate light emission from the device is increased, providing optimum light source performance.

Based on the foregoing, it is further theorized that by doping the GRIN film with particulate material, light can be scattered within the GRIN film itself, thus further enhancing the light emission from the device. For example, the GRIN film referred to above in Example 1 may be doped with alumina particles sized from about 0.1-100 micrometers, at a loading weight percent of about 0.1-10%. The particles of alumina tend to scatter light, and so the light that is being subjected to total internal reflection can be scattered at a new angle to enable it an opportunity to escape the device. Since the critical angle between adjacent layers is minimized, the probability that a scattered photon will enter the next closest layer is increased, and an overall increase in light emission can be realized.

There are several ways to generate or construct GRIN films. For example, in one embodiment, multiple films of known refractive index may be stacked using optical adhesives to tie or bond the layers together. This may also serve to aid in achieving an effective gradient RI, as is shown in Example 1.

In another embodiment, a stack of polymer films having various RIs may be compression molded into one continuous film. The resulting film will exhibit a gradient RI determined by the order in which the polymer films were arranged, highest to lowest.

In still another embodiment, the method of construction utilizes the effective medium theory. This theory states that given two materials of known refractive index, both of which are extremely thin, the refractive index of the composite formed from these layers can be tailored by simply controlling the relative thickness of the two layers. Two particular ways of doing this include using nanolayering polymer coextrusion technology or by employing vapor deposition techniques. It is theorized that as more layers are introduced in the GRIN film, the film becomes more effective at allowing light to escape the device. Therefore, the effective medium method of producing the GRIN film is a preferred method because the resulting GRIN film exhibits a smoother RI gradient.

The invention has been described with reference to the preferred embodiments. Obviously, modifications and alterations will occur to others upon reading and understanding the preceding detailed description. It is intended that the invention be construed as including all such modifications and alterations.

What is claimed is:

1. An OLED including a gradient refractive index film, wherein the gradient refractive index film comprises a composite film having a reducing refractive index from a first surface of the film to a second surface of the film, wherein the gradient refractive index film comprises at least two materials that, with reference to one another, exhibit a reduction in refractive index value as the materials progress away from the external light emissive surface upon which the film is disposed.

2. The OLED of claim 1 wherein the OLED is a light source.

3. The OLED of claim 1 wherein the OLED is a display.

4. The OLED of claim 1 wherein a critical angle of incidence between the second surface of the gradient refractive index film and an external environment is from at least about 45° and up to about 90°.

5. The OLED of claim 1 wherein a critical angle of incidence between any two internal materials within the gradient refractive index film is at least about 65° and up to about 90°.

6. The OLED of claim 1 wherein the gradient refractive index film shifts the color coordinates (ccx and ccy) of the OLED by no more than 10%.

7. The OLED of claim 1 wherein the on-axis luminance of the light source is increased by at least 4% as compared to the on-axis luminance of the same light source without the multilayer film.

8. The OLED of claim 1 wherein the first surface is directly adjacent a light emitting surface of the OLED.

9. The OLED of claim 1 wherein the second surface is exposed to air or another environment external to the gradient refractive index film.

10. The OLED of claim 1 wherein the OLED comprises at least a cathode, one or more organic light-emissive materials, an anode, and a light-transmissive substrate, and the gradient refractive index film is disposed adjacent the substrate.

11. The OLED of claim 10 wherein the substrate comprises glass or a light-transmissive polymer, and the gradient refractive index film is applied to an external surface of the substrate with an index matching adhesive.

12. The OLED of claim 1 wherein the OLED comprises a cathode, one or more light-emissive materials, and an anode, disposed on the gradient refractive index film.

13. The OLED of claim 1 wherein the OLED has more than one light-emitting surface, and the gradient refractive index film is disposed on at least one light emitting surface.

14. The OLED of claim 1 wherein the OLED has more than one light-emitting surface, and the gradient refractive index film is disposed on at least two light emitting surfaces, and the gradient refractive index film may or may not be the same on each of the at least two light emitting surfaces.

15. The OLED of claim 1 wherein the gradient refractive index film further includes a material that scatters light within the gradient refractive index film to increase light emission from the OLED.

16. The OLED of claim 15 wherein the material that scatters light within the gradient refractive index film comprises alumina.

* * * * *